(12) United States Patent
Chang (10) Patent No.: US 9,854,911 B1
(45) Date of Patent: Jan. 2, 2018

(54) SLIDE RAIL BRACKET ASSEMBLY (71) Applicant: Fu-Tien Chang, New Taipei (TW)

(72) Inventor: Fu-Tien Chang, New Taipei (TW)

(73) Assignee: Nan Juen International Co., Ltd., New Taipei (TW)

( * ) Notice: Subject to any disclaimer, the term of this patent is extended or adjusted under 35 U.S.C. 154(b) by 0 days.

(21) Appl. No.: 15/390,515

(22) Filed: Dec. 25, 2016

(51) Int. Cl.
*A47B 96/06* (2006.01)
*A47B 88/43* (2017.01)
*F16M 13/02* (2006.01)
*H05K 7/18* (2006.01)
*H05K 7/14* (2006.01)

(52) U.S. Cl.
CPC ............ *A47B 96/068* (2013.01); *A47B 88/43* (2017.01); *F16M 13/022* (2013.01); *H05K 7/1489* (2013.01); *H05K 7/183* (2013.01)

(58) Field of Classification Search
CPC ....... A47B 96/07; A47B 96/068; A47B 88/43; A47B 88/493; H05K 7/1489; H05K 7/183; F16L 3/015
USPC ............ 248/220.43; 312/334.47, 333, 330.1
See application file for complete search history.

(56) References Cited

U.S. PATENT DOCUMENTS 9,532,483 B1* 12/2016 Chang ................... H05K 7/1489
2016/0286683 A1* 9/2016 Chen .................... H05K 7/1489
2017/0013959 A1* 1/2017 Chen ...................... A47B 96/07

* cited by examiner

*Primary Examiner* — Todd M Epps (57) ABSTRACT

A slide rail bracket assembly includes a slide rail bracket including a bracket body and a positioning member affixed to one side of the bracket body, and a fastening device including a hook member that includes two hook bases affixed to an opposite side of the bracket body, two spring arms respectively extended from the hook bases, and a hooking portion connected between the spring arm, and a release member that includes two actuation portions respectively pivotally connected to the spring arms of the hook member, two bearing portions respectively extended from respective one ends of the actuation portions and two pull-off portions respectively extended from respective opposite ends of the actuation portions. Operating the release member to bias the actuation portions relative to the hook member can force the bearing portions into abutment against the bracket body and move the spring arms in direction away from the bracket body.

4 Claims, 8 Drawing Sheets

SLIDE RAIL BRACKET ASSEMBLY

BACKGROUND OF THE INVENTION

1. Field of the Invention

The present invention relates to sliding rail bracket mounting designs and more particularly to a slide rail bracket assembly, which comprises a slide rail bracket, and a fastening device for fastening the slide rail bracket to a mounting plate, wherein the fastening device comprises a hook member, and a release member operable to move the hook member by leverage so that the fastening device can be locked to or unlocked from the mounting plate conveniently with less effort, presenting pinch accidents.

2. Description of the Related Art

When mounting a slide rail in a rack computer server system, it is the normal way to connect the slide rail to a slide rail bracket, and then to fasten each of the two opposite ends of the slide rail bracket to a frame structure of the rack computer server system with a respective connecting devices. Each connecting device comprises a positioning column inserted through one side of the frame structure of the rack computer server system, and a lever hook hooked on an opposite side of the frame structure of the rack computer server system. However, when operating the connecting devices to lock the slide rail bracket to the frame structure of the rack computer server system or to unlock the slide rail bracket from the frame structure of the rack computer server system, the user needs to bias the lever hooks of the connecting devices directly. It is inconvenient to mount or to dismount the slide rail bracket. Further, when mounting or dismounting the slide rail bracket, pinch accidents can occur.

SUMMARY OF THE INVENTION

The present invention has been accomplished under the circumstances in view. It is therefore the main object of the present invention to provide a slide rail bracket assembly, which enables a release member of a fastening device to move a hook member by leverage so that the user can lock the slide rail bracket to a mounting plate or unlock the slide rail bracket from the mounting plate easily with less effort.

It is therefore another object of the present invention to provide a slide rail bracket assembly, which uses a hooking portion of a hook member of the fastening device and a holding-down portion of the release member to fasten the slide rail bracket to the mounting plate positively.

It is therefore another object of the present invention to provide a slide rail bracket assembly, which uses a notch of each actuation portion of the release member for engagement with the mounting plate, preventing vibration of the slide rail bracket relative to the mounting plate.

To achieve these and other objects of the present invention, a slide rail bracket assembly comprises a slide rail bracket and a fastening device. The slide rail bracket comprises a bracket body, and a positioning member affixed to one side of the bracket body. The fastening device comprises a hook member and a release member. The hook member comprises two hook bases affixed to an opposite side of the bracket body, two spring arms respectively extended from the hook bases, and a hooking portion connected between the spring arms. The release member comprises two actuation portions respectively pivotally connected to the spring arms of the hook member, two bearing portions respectively extended from respective one ends of the actuation portions, and two pull-off portions respectively extended from respective opposite ends of the actuation portions. Operating the release member to bias the actuation portions relative to the hook member can force the bearing portions into abutment against the bracket body and move the spring arms in direction away from the bracket body.

Preferably, the release member further comprises a notch located on each actuation portion adjacent to the respective pull-off portion. Preferably, the release member further comprises a holding-down portion connected between respective distal ends of the pull-off portions remote from the respective actuation portions to face toward the positioning member.

DETAILED DESCRIPTION OF THE PREFERRED EMBODIMENT

Referring to FIGS. 1-4, a slide rail bracket assembly in accordance with the present invention is shown. The slide rail bracket assembly comprises a slide rail bracket 1 and a fastening device 2 adapted for fastening the slide rail bracket 1 to a mounting plate 3.

The slide rail bracket 1 comprises a bracket body 11, and a positioning member 12 located on one side of a rear end of the bracket body 11. The positioning member 12 comprises a base block 121 located on the said one side of the bracket body 11, and a plurality of positioning columns 122 extended from the base block 121 and disposed in parallel to the rear end of the bracket body 11.

The fastening device 2 comprises a hook member 21 and a release member 22. The hook member 21 comprises at least one hook base 211 fixedly mounted on an opposite side of the bracket body 11 opposite to the positioning member 12, two spring arms 212 extended from the at least one hook base 211 and disposed in parallel to the rear end of the bracket body 11, and a hooking portion 213 connected between the distal ends of the two spring arms 212. The release member 22 comprises at least one actuation portion 221 respectively pivotally connected to the spring arms 212 of the hook member 21, at least one bearing portion 222 and at least one pull-off portion 223 respectively extended from respective opposite ends of the at least one actuation portion 221 in reversed directions, and a notch 224 located on each actuation portion 221 adjacent to the respective pull-off portion 223.

Further, in this embodiment, the hook member 21 comprises two hook bases 211; the two spring arms 212 of the hook member 21 of the fastening device 2 are respectively extended from the hook bases 211; the release member 22 comprises at least one two actuation portions 221 respectively pivotally connected to the spring arms 212 of the hook member 21, two bearing portions 222 and two pull-off portions 223 respectively extended from respective opposite ends of the actuation portions 221 in reversed directions, and a notch 224 located on each actuation portion 221 adjacent to the respective pull-off portion 223. In this embodiment, the release member 22 further comprises a holding-down portion 225 connected between respective distal ends of the pull-off portions 223 remote from the respective actuation portions 221 to face toward the positioning member 12.

Figure 1:
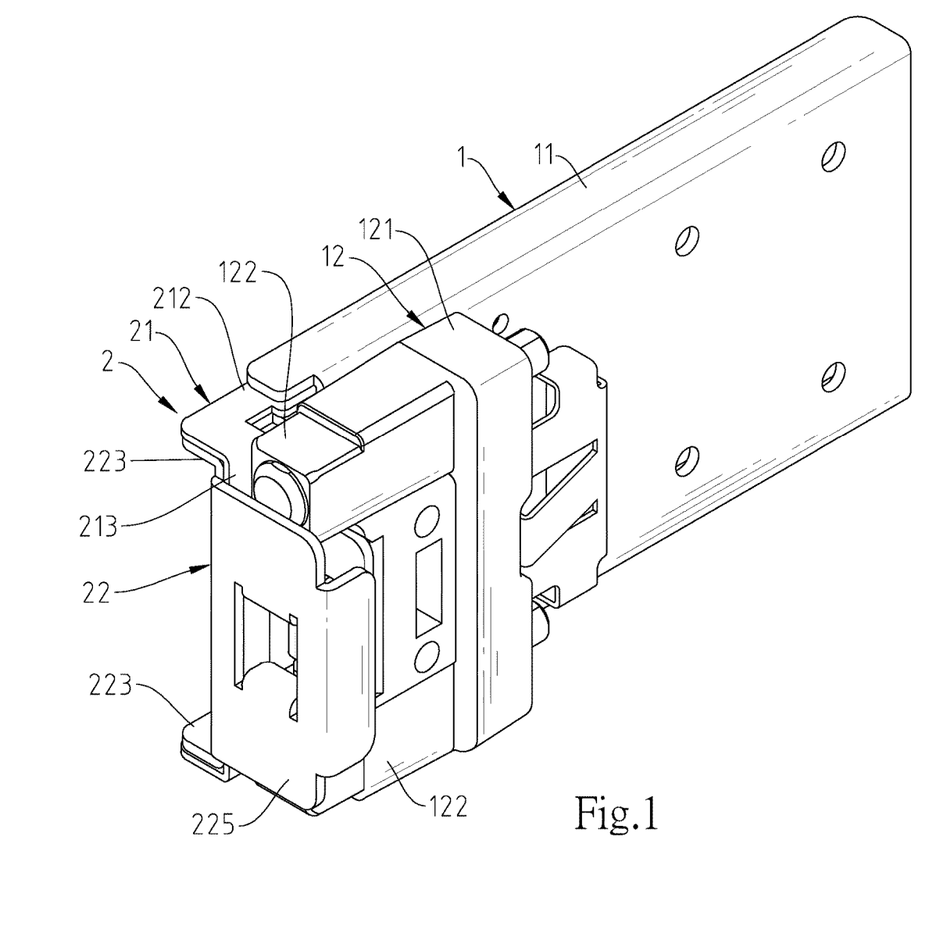
FIG. 1 is an oblique front elevational view of a slide rail bracket assembly in accordance with the present invention.
Figure 2:
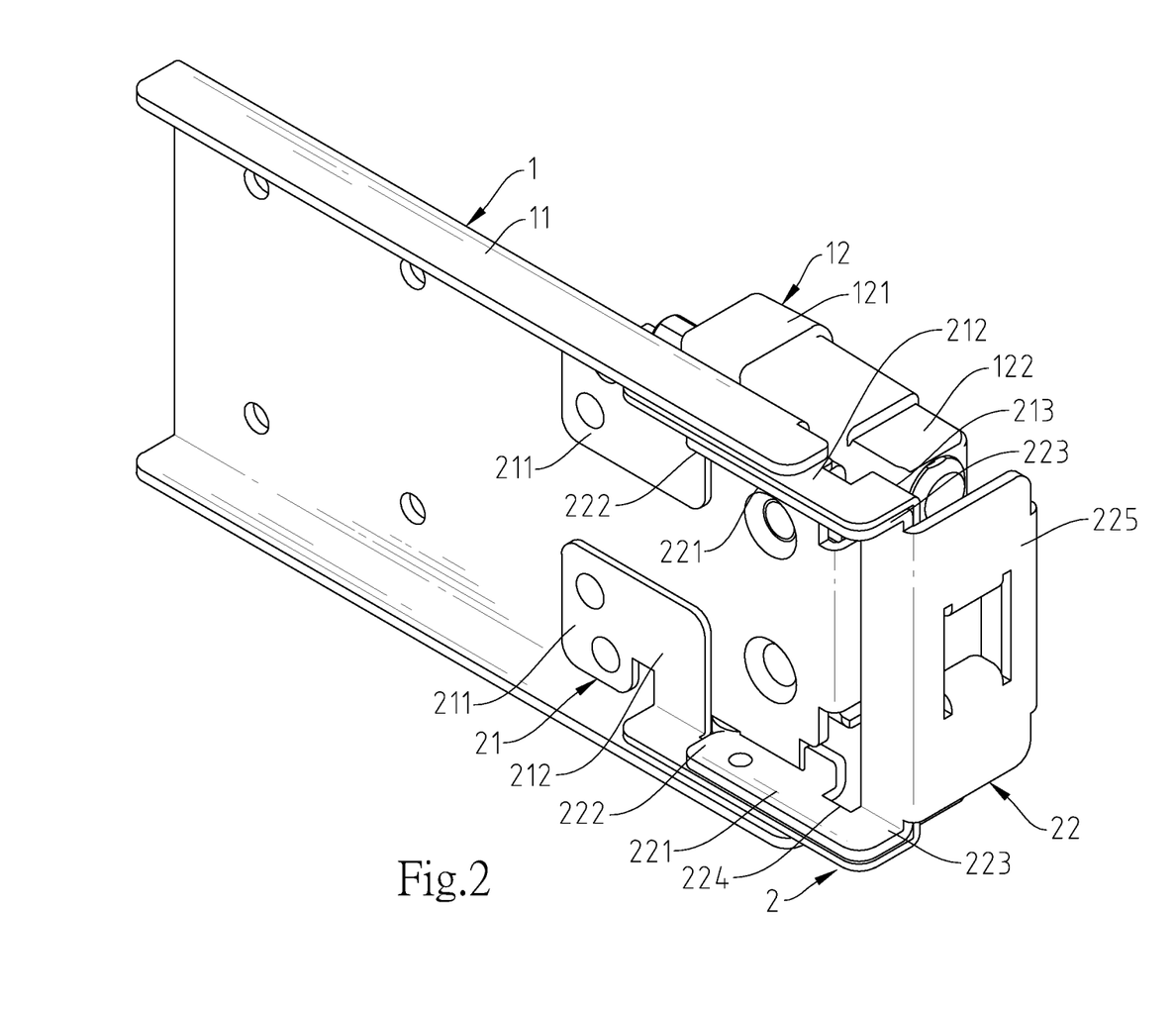
FIG. 2 is an oblique rear elevational view of the slide rail bracket assembly in accordance with the present invention.
Figure 3:
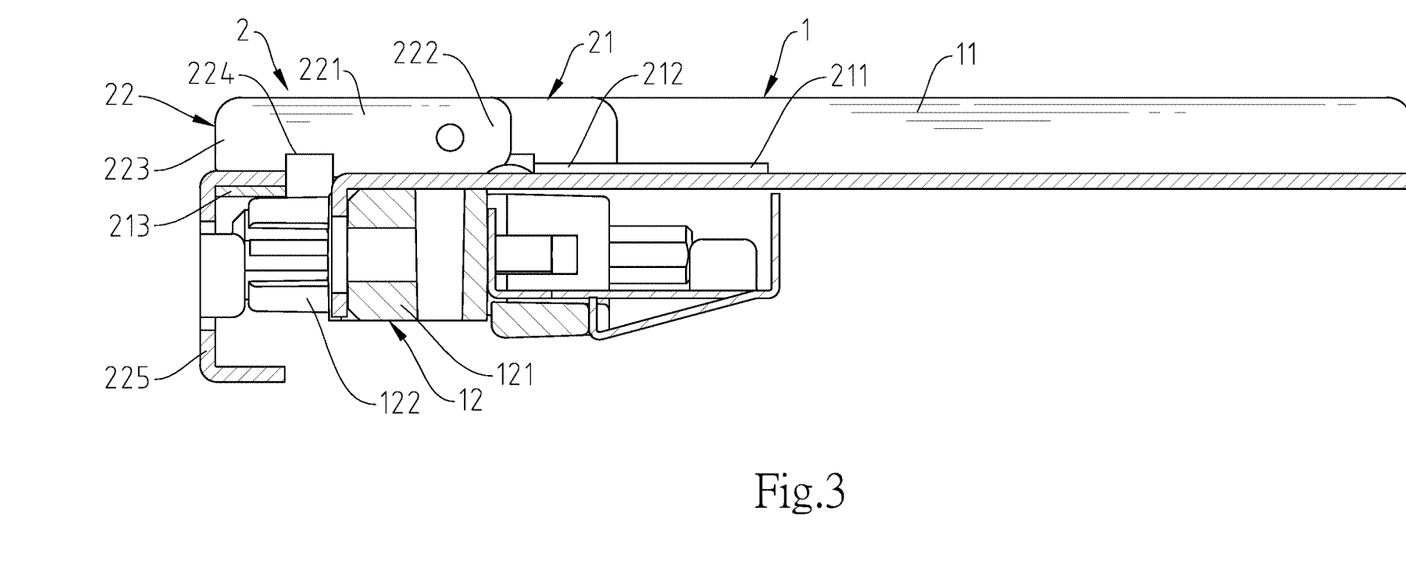
FIG. 3 is a sectional side view of the slide rail bracket assembly in accordance with the present invention.
Figure 4:
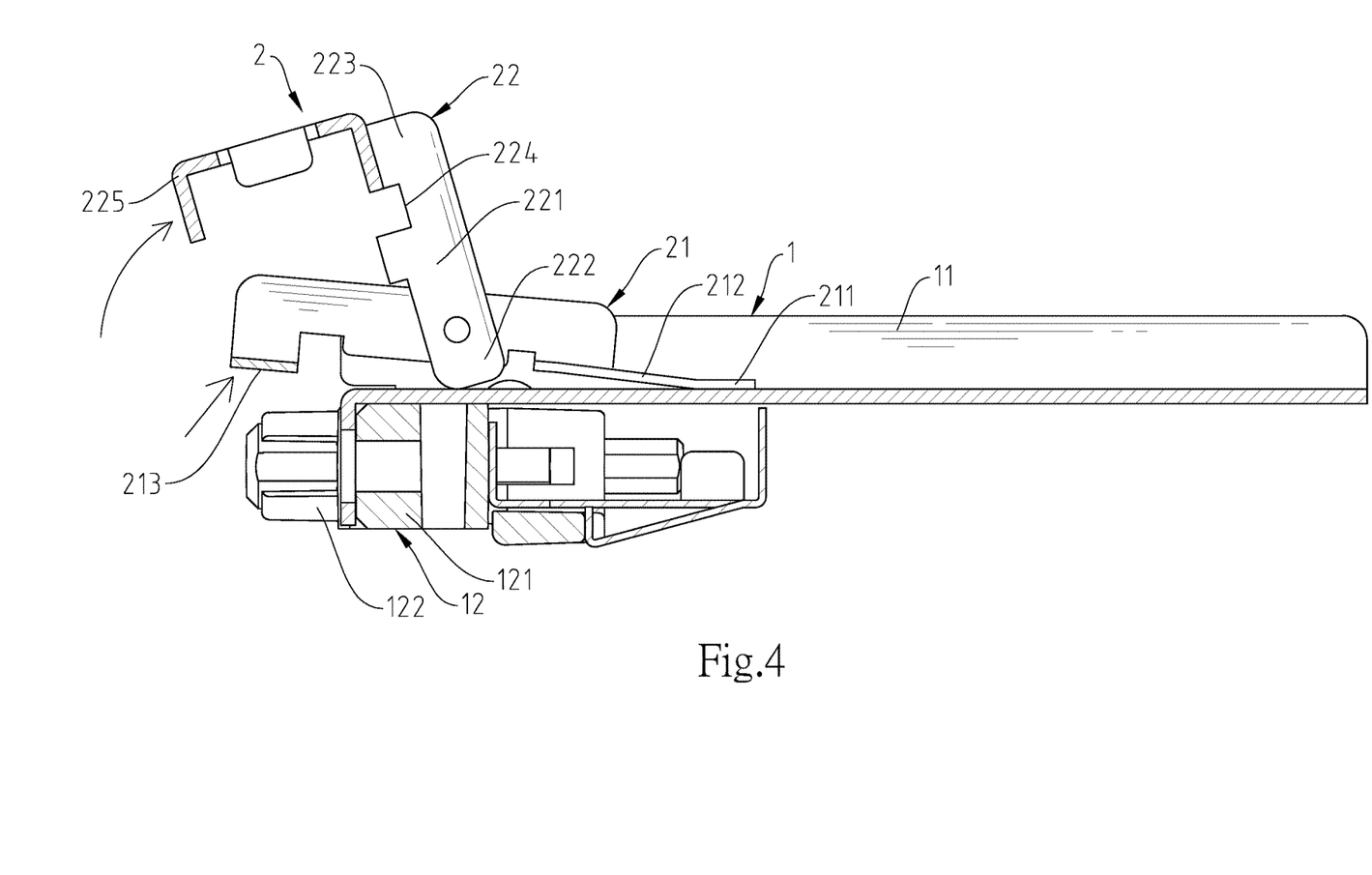
FIG. 4 is a schematic sectional side view of the present invention, illustrating the release member biased, the hook member moved in direction away from the bracket body of the slide rail bracket.
Figure 5:
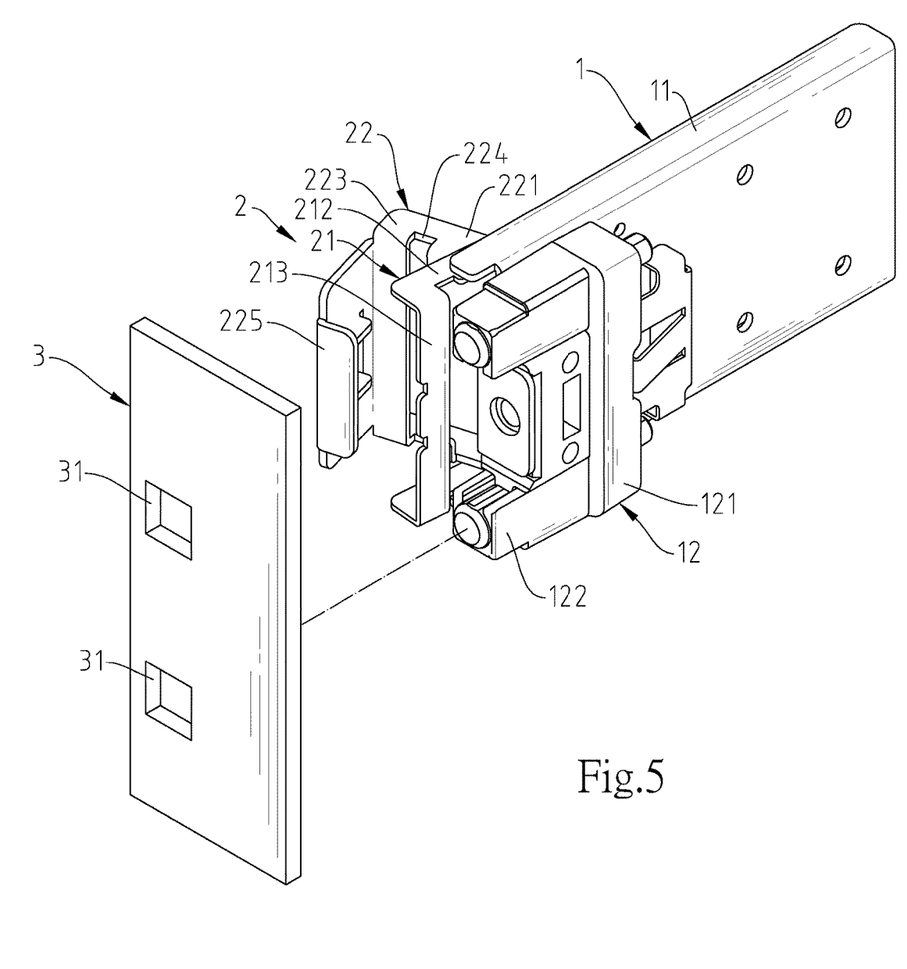
FIG. 5 is a schematic view illustrating the relationship of the slide rail bracket assembly and a mounting plate.

Referring to FIG. 5 and FIG. 4 again, when operating the release member 22 to bias the actuation portions 221 relative to the spring arms 212 of the hook member 21 in one direction, the bearing portions 222 are forced to abut against the surface of the bracket body 11 and to further push the spring arms 212 in direction away from the bracket body 11, moving the hooking portion 213 of the hook member 21 and the holding-down portion 225 of the release member 22 in direction away from the positioning member 12 of the slide rail bracket 1.

Figure 6:
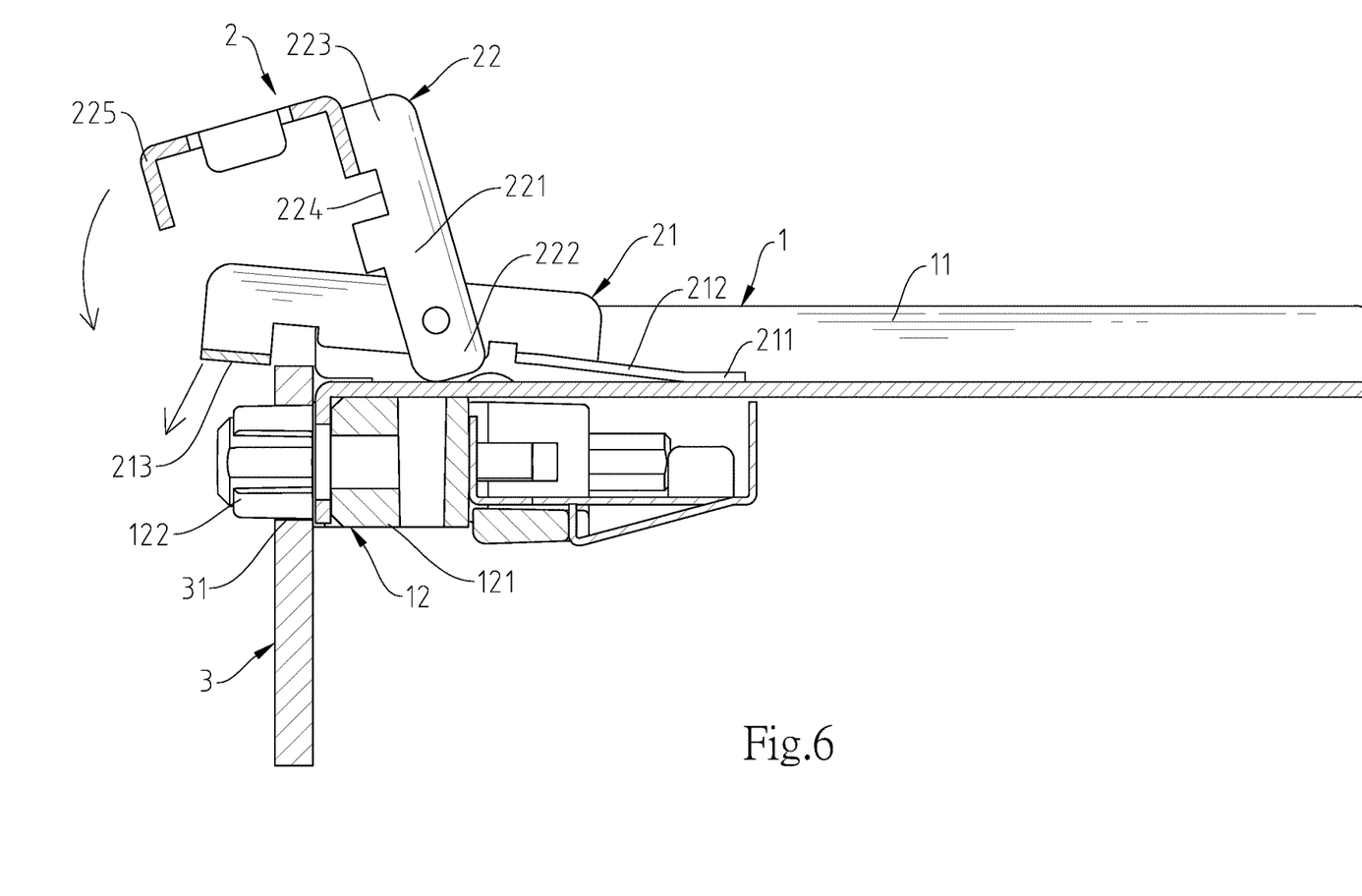
FIG. 6 is a schematic sectional view illustrating installation of the slide rail bracket assembly in the mounting plate.
Figure 7:
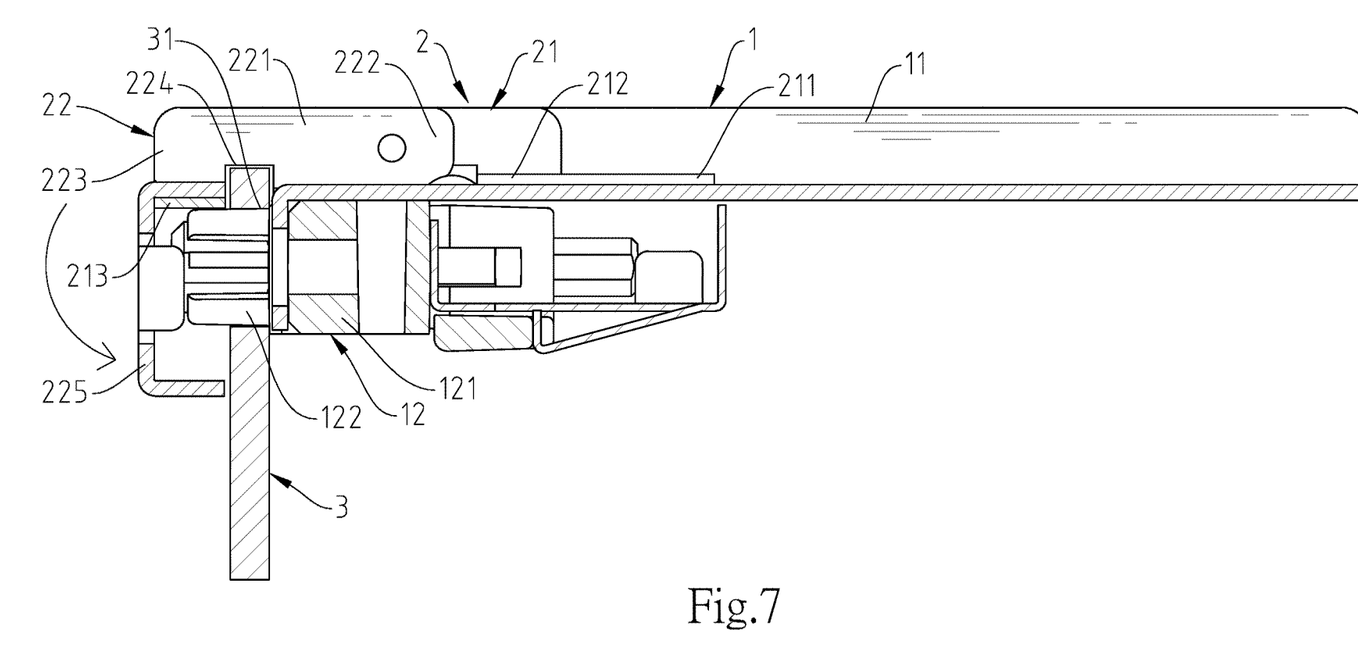
FIG. 7 corresponds to FIG. 6, illustrating the slide rail bracket assembly locked to the mounting plate.
Figure 8:
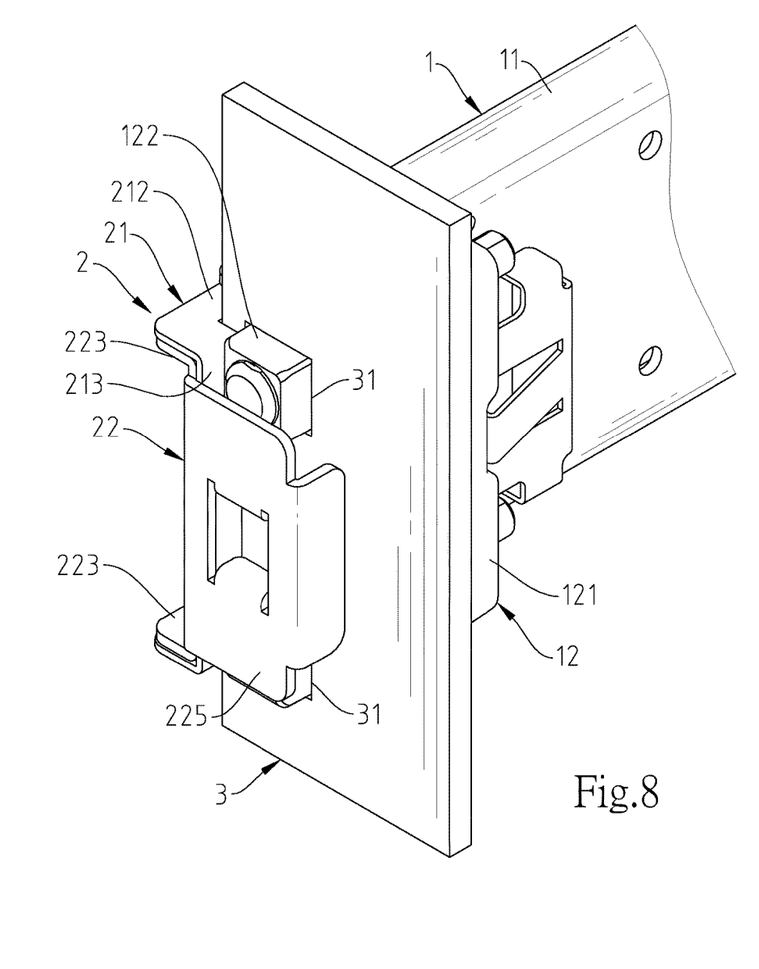
FIG. 8 is an elevational view of the present invention, illustrating the slide rail bracket assembly locked to the mounting plate.

Referring also to FIGS. 6-8, after moved the hooking portion 213 of the hook member 21 and the holding-down portion 225 of the release member 22 far apart from the positioning member 12 of the slide rail bracket 1, the user can insert the positioning column 122 of the slide rail bracket 1 into respective locating holes 31 of the mounting plate 3, and then release the release member 22. At this time, the spring arms 212 of the hook member 21 immediately return to their previous shape in proximity to the bracket body 11 subject to the effect of their elastic restoring energy, thereby forcing the hooking portion 213 of the hook member 21 and the holding-down portion 225 of the release member 22 to hook on a back side of the mounting plate 3 opposite to the positioning member 12. At the same time, the notches 224 of the release member 22 are forced into engagement with opposing lateral edges of the mounting plate 3, and thus, the bracket body 11 of the slide rail bracket 1 is locked to the mounting plate 3.

Referring to FIGS. 5 and 6 again, on the contrary, when wishing to release the slide rail bracket 1 from the mounting plate 3, operate the release member 22 to bias the actuation portions 221 relative to the spring arms 212 of the hook member 21 in the reversed direction and to move the hooking portion 213 of the hook member 21 and the holding-down portion 225 of the release member 22 in direction away from the positioning member 12 of the slide rail bracket 1, releasing the slide rail bracket 1 from the mounting plate 3.

What is claimed is:

1. A slide rail bracket assembly, comprising:
   a slide rail bracket comprising a bracket body and a positioning member located on a side of a rear end of said bracket body, said positioning member comprising a base block located on said side of said bracket body, and a plurality of positioning columns extending from said base block and disposed in parallel with said rear end of said bracket body; and
   a fastening device comprising a hook member and a release member, said hook member comprising at least one hook base fixedly mounted on an opposite side of said bracket body opposite to said positioning member, at least one spring arm extending from said at least one hook base and disposed in parallel with said rear end of said bracket body and a hooking portion extending from said at least one spring arm toward said positioning member, said release member comprising at least one actuation portion pivotally connected to said at least one spring arm of said hook member, at least one bearing portion extending from said at least one actuation portion at a side and at least one pull-off portion extended from said at least one actuation portion at an opposite side, said release member being operable to bias said at least one actuation portion relative to said at least one spring arm of said hook member to move said at least one bearing portion into abutment against said bracket body and to force said at least one spring arm in a direction away from said bracket body.

2. The slide rail bracket assembly as claimed in claim 1, wherein said at least one hook base of said hook member comprises at least two hook bases, and said at least at least one spring arm comprises at least two spring arms respectively extending from said at least two hook bases; said hooking portion is connected between said at least two spring arms; said at least one actuation portion of said release member comprises at least two actuation portions, said at least one bearing portion comprising at least two bearing portions respectively extending from respective ends of said at least two actuation portions, and said at least one pull-off portion comprises at least two pull-off portions respectively extending from respective opposing ends of said at least two actuation portions.

3. The slide rail bracket assembly as claimed in claim 1, wherein said release member further comprises at least one notch respectively located on said at least one actuation portion adjacent to said at least one pull-off portion.

4. The slide rail bracket assembly as claimed in claim 1, wherein said release member further comprises a holding-down portion extending from said at least one pull-off portion toward said positioning member.

* * * * *